(12) United States Patent
Miller

(10) Patent No.: US 8,779,357 B1
(45) Date of Patent: Jul. 15, 2014

(54) MULTIPLE IMAGE METROLOGY

(71) Applicant: FEI Company, Hillsboro, OR (US)

(72) Inventor: Thomas G. Miller, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/864,747

(22) Filed: Apr. 17, 2013

Related U.S. Application Data

(60) Provisional application No. 61/792,774, filed on Mar. 15, 2013.

(51) Int. Cl.
*G01B 15/04* (2006.01)
*H01J 37/28* (2006.01)
*H01J 37/00* (2006.01)

(52) U.S. Cl.
USPC .......... 250/306; 250/307; 250/310; 250/397; 250/396 R; 250/492.2

(58) Field of Classification Search
USPC .......... 250/306, 307, 310, 397, 396 R, 492.2; 382/151
See application file for complete search history.

(56) References Cited

U.S. PATENT DOCUMENTS

| | | | |
|---|---|---|---|
| 6,889,113 B2 | 5/2005 | Tasker et al. | |
| 7,308,334 B2 | 12/2007 | Tasker et al. | |
| 7,664,566 B2 | 2/2010 | Tasker et al. | |
| 7,800,062 B2 * | 9/2010 | Goldenshtein et al. | 250/310 |
| 7,880,151 B2 | 2/2011 | Wells | |
| 8,095,231 B2 | 1/2012 | Tasker et al. | |
| 2006/0126916 A1* | 6/2006 | Kokumai | 382/151 |
| 2012/0267528 A1* | 10/2012 | Sakai et al. | 250/307 |

* cited by examiner

*Primary Examiner* — Nikita Wells
(74) *Attorney, Agent, or Firm* — Scheinberg & Associates, PC; Michael O. Scheinberg

(57) ABSTRACT

Metrology is performed using multiple registered images derived from one or more charged particle beams. Measurements combine features from one image that may not be visible in a second image to determine relationships that cannot be determined from a single image. In one embodiment, measurements use features from different element maps to determine a relationship between features, such as a distance or angle between two features in the first image at a location determined by a distance from a feature on the second image.

36 Claims, 5 Drawing Sheets

MULTIPLE IMAGE METROLOGY

This Application claims priority from U.S. Provisional Application No. 61/792,774, filed Mar. 15, 2013, which is hereby incorporated by reference.

TECHNICAL FIELD OF THE INVENTION

The present invention relates to determining dimensions using multiple images.

BACKGROUND OF THE INVENTION

"Microfabrication" is the fabrication of extremely small structures, having features on the order of microns or nanometers. Microfabrication processes are used, for example, to produce integrated circuits, to build magnetic heads for reading and writing to magnetic media, and to fabricate miniature mechanical or electromechanical devices. During microfabrication, it is necessary to measure critical dimensions to ensure that the fabrication process is operating properly and that the parts being produced meet the product specification.

To determine critical dimension and other characteristics of microscopic objects, it is often necessary to obtain images of the object and then to measure the image. For example, microscopic structures are often viewed and measured using electron microscope images.

During the development of semiconductor devices, measuring the distribution of chemical elements present in the device structure is used to monitor process success and quality. One technique for identifying materials at points on a work piece is called energy dispersive x-ray spectroscopy (EDS or EDX), which can be used for elemental analysis or chemical characterization of a sample. In EDX, an electron beam is directed toward a sample and the energies of x-rays coming from the sample in response to the electron beam are measured and plotted as a histogram to form a spectrum. The measured spectrum can be compared to the known spectra of various elements to determine which elements and compounds are present.

EDX can be used to form elemental maps that show the spatial distribution of elements in a sample. The elemental map is created by moving an electron beam point by point over the sample. Several maps, each showing a single element, can be produced to show the composition of an area of a work piece. Other techniques, such as electron energy loss spectroscopy (EELS) and high-angle annular dark-field imaging (HAADF), can produce non-elemental images as well as elemental maps. EELS measures the energy absorbed as electrons pass through the sample. Different materials in the sample cause electrons to lose different amount of energy as they pass through, so the materials of the sample can be identified by measuring the amount of energy lost by the electrons. The energy of the electrons passing through the sample is measured and the energy loss is determined by subtracting the exiting energy from the energy of the electrons in the original beam. EELS can not only determine individual elements, but also their chemical states. HAADF is a method of mapping samples in a scanning transmission electron microscope (STEM). The images are formed by collecting only high angle scattered electrons using an annular dark-field detector and is sensitive to variations in the atomic number of atoms in a sample.

In order to make measurements on an image or perform other metrology activities, there has to be enough contrast to recognize features found in the image. In some methods, contrast for heavier elements, such as tungsten (W), tantalum (Ta), and hafnium (Hf), is different from the contrast for light elements, such as nitrogen (N), oxygen (O), and carbon (C). Different elements may appear in different images with different degrees of clarity. It can be difficult to determine measured geometric relationships between features composed of different elements, because the different elements may not both appear in the same image.

SUMMARY OF THE INVENTION

An object of the invention is to provide an efficient method to measure microscopic spatial relationships.

Some embodiments of the invention provide a method for combining the information from at least two images of the same object to perform automated metrology measurements when the individual images alone do not contain enough information alone to perform those activities.

Some embodiments of the invention use images formed with the operation of charged particle beam systems. For example, embodiments of the invention use images acquired with a scanning electron microscope (SEM) with multiple detectors, focused ion beam (FIB) microscopy with multiple detectors, a scanning transmission electron microscope (STEM) with bright field or dark field, or various segmented detectors, or a transmission electron microscope (TEM). Some embodiments of the invention use multiple images, each displaying a different element of a work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1A:
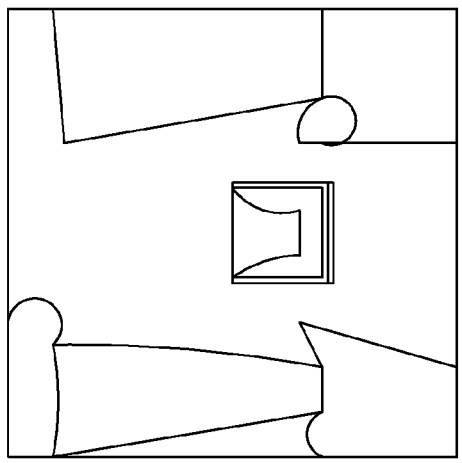
FIGS. 1A-1F show a set of images of a single transistor structure which include a non-elemental HAADF map and the elemental maps aluminum (Al), nickel (Ni), hafnium (Hf), tantalum (Ta), and tungsten (W)
Figure 1B:
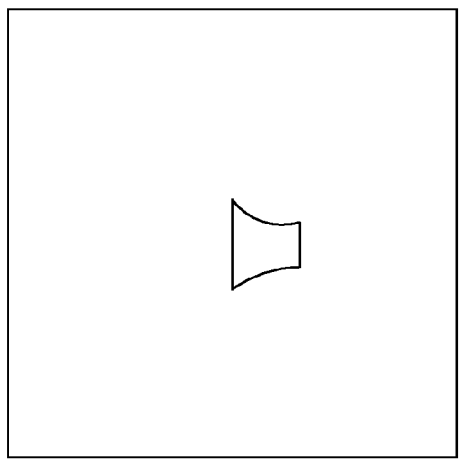
Figure 1C:
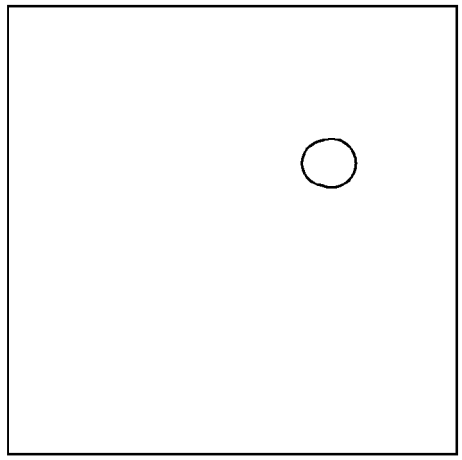
Figure 1D:
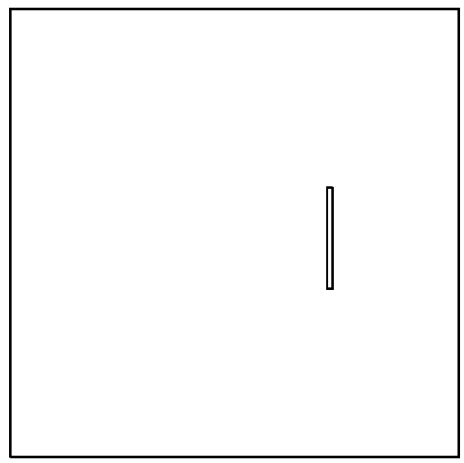
Figure 1E:
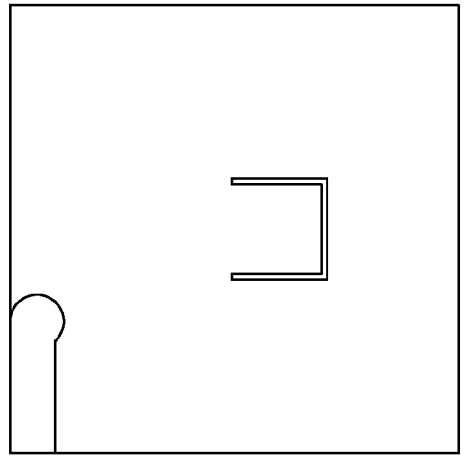
Figure 1F:
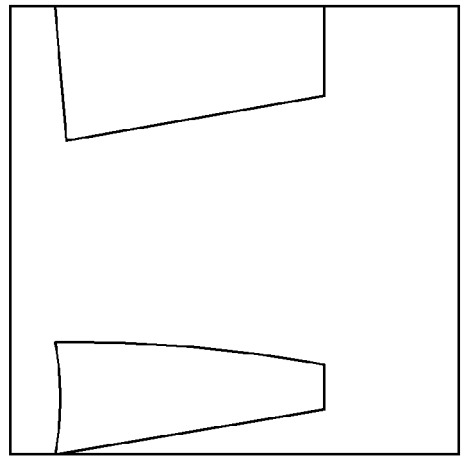

Embodiments of the invention provide a method for determining geometric or other relationships between features that are not sufficiently discernible in a single image for measurement. That is, one of the features is either not visible in the image or has insufficient contrast to accurately measure. Embodiments provide for measuring a distance or angle, for example, between a first feature and a second feature, when the first feature is visible in an image that does not adequately show the second feature, and the second feature is visible in a different image that does not show the first feature with sufficient contrast to be accurately measured. Embodiments are useful in measuring dimensions of features composed of different elements that appear on different elemental maps. "Features" as used herein may include a single edge or a combination of edges, connected or not. For example, a straight or curved line, connected lines that form a two dimensional shape, or spaces between lines or shapes.

In order to measure critical dimensions of a specimen, multiple images often must be created using different methods such as EDX, EELS, and HAADF. The images or maps produced from the results of these techniques may show only some structures of the specimen while other structures are not shown or are not shown with sufficient contrast to be used in performing accurate measurements. For example, in a tungsten elemental map, only the structures made of tungsten will be seen in the image while all other structures will not be shown. Some measurements between features of a specimen are performed using the visible features of one image and the visible features of at least one other image. These visible features in the different images are preferably shown with enough contrast to perform measurements, often with sub-nanometer accuracy. For example, a structure visible in a tungsten elemental map and a structure visible in a hafnium elemental map can be used together to measure the distance between the two structures or an angle between edges on the different structures.

Embodiments of the invention may use software metrology tools. "Metrology tool" is hereby defined as a software process applied to an image to identify and locate at least one feature and/or to determine a dimension of at least one feature in the image. For example, a metrology tool may automatically find a location of a feature in an image, a dimension between two or more features in an image, or a dimension of a single feature in an image. These dimensions include the length, width, or height of a feature or the distance or angle between two or more features. Examples of such metrology tools, which can include a graphic shape displayed on a screen and an associated function, are described in U.S. Pat. No. 8,095,231, which is hereby incorporated by reference. Metrology tools can operate on a region specified, for example, by a user drawing a box on a portion of an image, and then the tool performs an associated function, such as finding an edge in the box, determining a distance or angle between edges, finding a pattern outside the box that matches the pattern within the box, etc.

Individual metrology tools may include arc finders, edge finders, line fit finders, or pattern locators. Arc finders automatically identify circular features in the region in which they are placed over and are able to return the coordinates of the center of the arc, the angle between the ends of the arc, the length of the arc, the distance between the ends of the arc, and/or the radius of the arc. Edge finders automatically determine and locate an edge of a feature or set of edges of features in the region in which they are placed over. Two edge finders can measure the distance between two edges in the set of edges. In some cases, a single edge finder may have the combined abilities of two edge finders; the single edge finder can locate two edges and measure the distance between the two edges. Line fit finders automatically determine and locate linear features in the region in which they are placed over and are able to determine the equation of a line along a region of an image. If multiple line fit finders are used, the resulting data can be used to determine angles between edges in the image data. Pattern locators determine and locate instances of a specified pattern in the region in which they are placed over. An "automated" metrology tool can be placed manually or automatically and then automatically performs a function. The function can optionally be repeated over an area larger than the field of view in which the sample is placed, for example, by scanning a large area of the sample, recognizing similar features and performing similar measurements. Some embodiments use a graphical tool referred to as "shape-linking," in which an edge finder on one image is linked to a different edge finder on a different image. This allows users to graphically create interactions between edge finders on different images with ease.

When multiple images are used together, the images must be registered, i.e., aligned, to each other. In some cases the image sets are inherently already registered. For example, if a scan probe is used to generate the image, and simultaneous detectors are creating different images, and if there is no undo time-lag in detection, then the images will be automatically correlated. In other cases a registration step might be needed which could be based on a cross-correlation technique, or other alternative pattern recognition and alignment technique. Registering can involve a transformation of an image by translation, rotation, and/or scaling as well as other more complicated transformations. When images are obtained simultaneously using the same detector, registration between different maps produced tends to be inherently good. For example, when a detector used for elemental analysis is common to all the maps produced, such as when EELS is used sequentially to create different elemental maps, registration between the different maps produced by these techniques is inherently good. But even when different images are obtained within minutes of each other using the same equipment, the images tend to drift because of thermal, mechanical, or electrical instabilities. Typically, drift correction is employed during the image acquisition sequence to improve image registration. Drift correction techniques are known and are described, for example, in U.S. Pat. No. 7,880,151 to Wells et al. for "Beam Positioning for Beam Processing." In some cases, one image, such as an HAADF non-elemental map, might have a slight registration error associated with differing acquisition time delays related to scanning. In the case that registration between images is off, reregistration can be performed as described above.

FIGS. 1A-1E show different types of images of a single specimen. For example, this set of images contains a non-elemental map and multiple elemental maps of a transistor structure. FIG. 1A is a HAADF non-elemental map, and FIGS. 1B-1E are the elemental maps aluminum (Al), nickel (Ni), hafnium (Hf), tantalum (Ta), and tungsten (W), respectively. These images are well registered with each other.

According to some embodiments, once the images are well registered, an image is selected by a user to become the reference image. A first automated metrology tool is selected to identify a first feature located within the reference image. A second image, which contains a second feature, is selected by the user. A second automated metrology tool is selected to identify the second feature in the second image. The first feature and the first automated metrology tool can be used to determine the positioning of the second metrology tool, or vice versa. In some embodiments, the first geometric feature and the automated metrology tool used on the first geometric feature are displayed on the second image as a visual reference point for the second automated metrology tool, or vice versa. Another metrology tool can then determine a geometric relationship, such as a distance or angle, between the first geometric feature and the second geometric feature.

Figure 2:
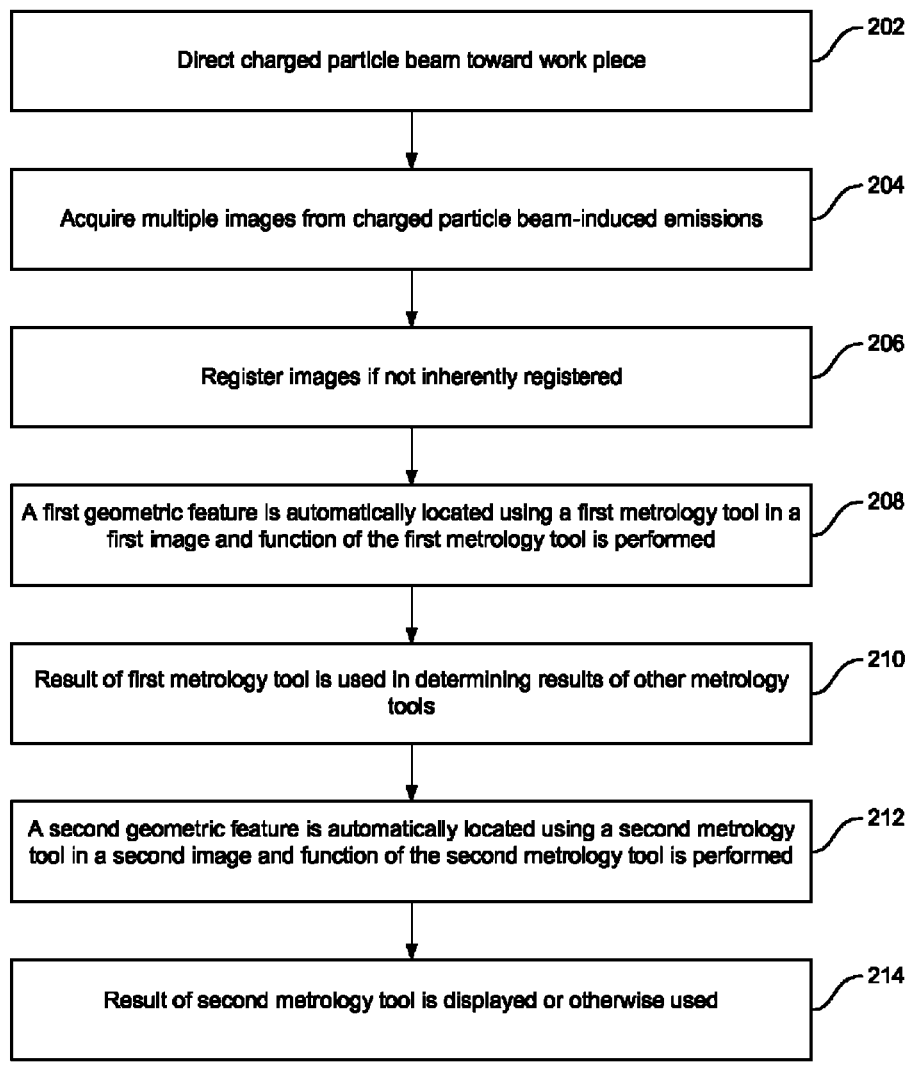
FIG. 2 is a flow chart showing a method of measuring a horizontal dimension between two geometric features in one image at a position defined by a geometric feature in a second image.

FIG. 2 is a flow chart showing a method of measuring a horizontal dimension between two geometric features in a first image using the vertical position of a third geometric feature in a second image, which is well registered with the other image, as a reference point in the second image to perform the measurement of the horizontal dimension with accuracy. In step 202, a charged particle beam is directed toward a work piece. In step 204, first and second images are acquired using one or more detectors in a charged particle beam system. In some embodiments, the charged particle beam scans more than once, with different images being acquired during different scans. In some embodiments, multiple images are acquired during a single scan from one or more detectors. In step 206, the first and second images are registered, if they are not inherently registered from the acquisition method. In step 208, a first geometric feature is automatically located using a first metrology tool in a first image and the function of the first metrology tool is performed. In step 210, the result of the first metrology tool is used in determining results of other metrology tools that may be used. In some embodiments, this result may be displayed on any of the images of the set of well registered images. In step 212, a second geometric feature is automatically located using a second metrology tool in a second image and the function of the second metrology tool is performed. In step 214, the result of the second metrology tool is displayed or otherwise used.

Figure 3A:
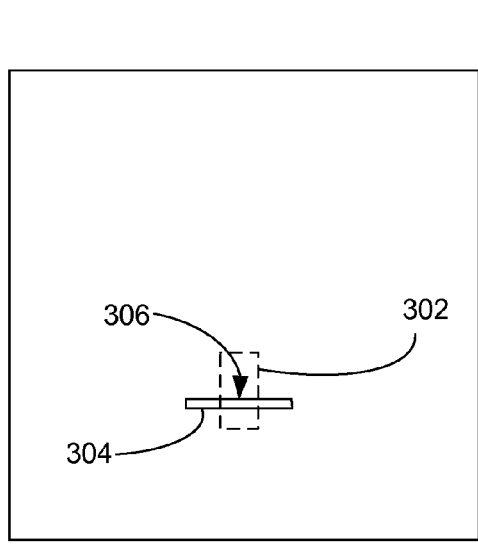
FIGS. 3A-3C illustrate the steps of FIG. 2.
Figure 3B:
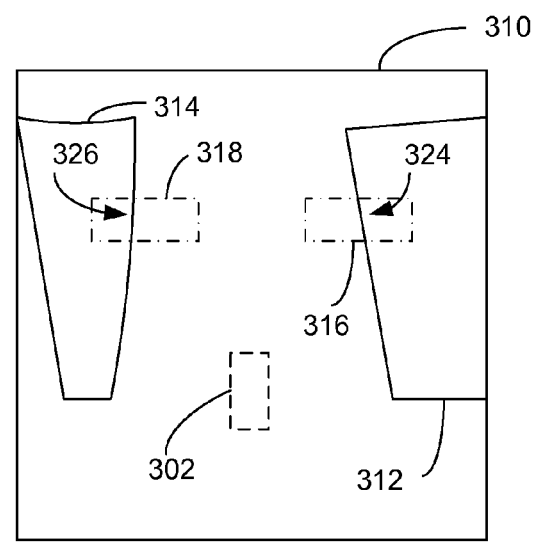
Figure 3C:
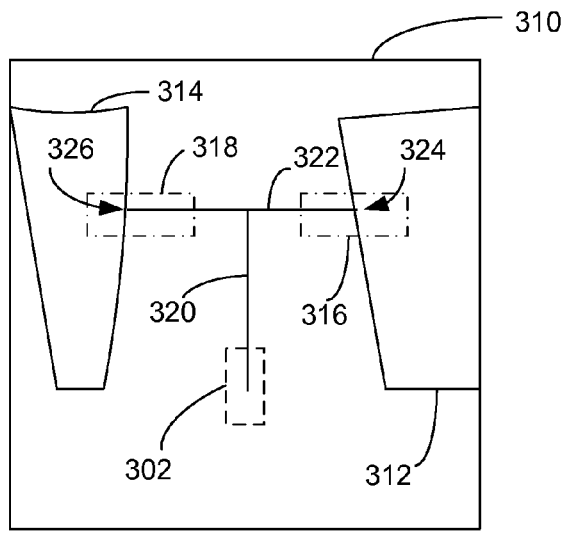

FIGS. 3A-3C illustrate a method of determining the horizontal distance between two geometric features at a particular height in an image. The particular height being defined by a third feature that is not visible in the image that shows the two geometric features, but that is visible in another image that is well registered with the first image. FIG. 3A shows a first image of a first type of a portion of a work piece. FIG. 3B shows a second image of a different type of the same portion of the work piece, with some of the information from the first image transferred to the second image. FIG. 3C is the same image as FIG. 3B but also shows the calculation of a spatial relationship, in this case distance, between two features visible in the second image using information from the first image.

FIG. 3A shows a first edge finder 302 placed over a region containing a visible first geometric feature 304 in a first image 300, a hafnium elemental map of a transistor structure, of a set of well registered images. This first edge finder 302 determines the location of a first edge 306 of the first geometric feature 304. The first edge 306 is common to all the images in a set of images, even if it is not visible in all the images, and since all the images are well registered, the location of the first edge 306 may be used as a point of reference in all the images in the set of images. FIG. 3B shows a second edge finder 316 and a third edge finder 318 placed over regions in a second image 310, a tungsten elemental map of the same transistor structure, containing a visible second geometric feature 312 and a visible third geometric feature 314, respectively. The two edge finders determine the location of a second edge 324 of the second geometric feature 312 and a third edge 326 of the third geometric feature 314. FIG. 3C shows the horizontal distance 322 between the second edge 324 and the third edge 326 are then automatically determined by the second edge finder 316 and the third edge finder 318. The horizontal distance 322 between the second edge 324 and the third edge 326 is calculated using the position of the first edge 306 as a reference point. The location of the second edge 324 and the location of the third edge 326 are at the same vertical distance 320 away from the location of the first edge 306.

In some embodiments, the horizontal distance 322 between the second edge 324 and third edge 326 is displayed on the image 310. In some embodiments, the horizontal distance 322 between the second edge 324 and third edge 326 is used in other functions. In some embodiments, the user can locate the second edge 324 and third edge 326 as well as determine the distance between the two edges using a single automated metrology tool such as a single edge finder.

Figure 4A:
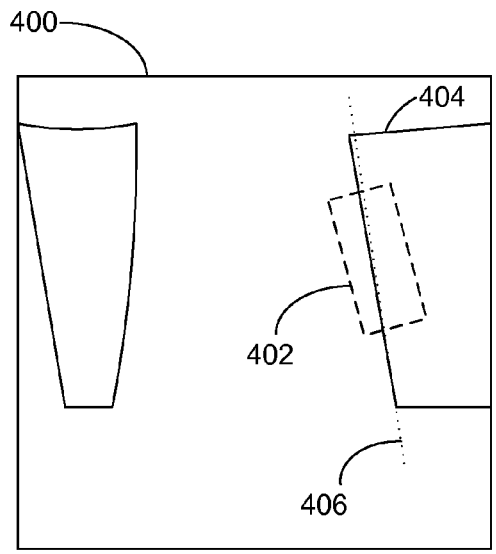
FIGS. 4A-4C illustrate the steps of a method of determining the angle between a first feature visible in a first image but not visible in a second image, and a second feature not visible in the first image but visible in the second image.
Figure 4B:
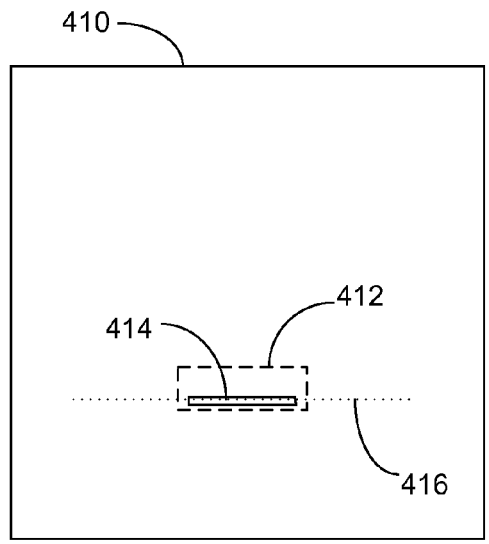
Figure 4C:
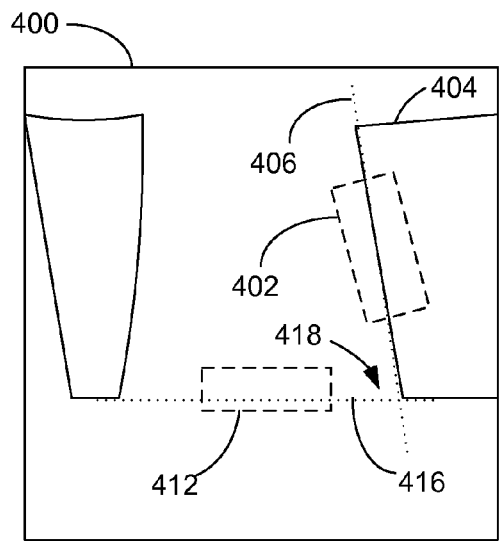

FIGS. 4A-4C show a method of determining the angle between a first feature visible in a first image but not visible in a second image and a second feature not visible in the first image but visible in the second image. FIG. 4A shows a first image of a first type of a portion of a work piece. FIG. 4B shows a second image of a second type of the same portion of the work piece. FIG. 4C is the same image as FIG. 4A but also shows the measurement of a spatial relationship of the features in the first image using spatial information from a feature of the second image. FIG. 4A shows a first line fit finder 402 is placed over a region containing a first geometric feature 404 in the first image 400, a tungsten elemental map of a transistor structure. The first line fit finder 402 determines and depicts a first line 406 that best fits the entire edge of the first geometric feature 404 in the first image 400. FIG. 4B shows a second line fit finder 412 is placed over a region containing a second geometric feature 414 in the second image, a hafnium elemental map of the same transistor structure. The second line fit finder 412 determines and depicts a second line 416 that best fits the entire edge of the second geometric feature 414 in the second image. In some embodiments, the first line 406 is also depicted in the second image 410. FIG. 4C shows the angle 418 between the two lines (406 and 416) of best fit can then be determined.

In some embodiments, the angle between the two lines of best fit may be determined by another metrology tool or another software tool. In some embodiments, the angle is displayed on at least one of the images of the set of images. In some embodiments, the angle is used in another function.

Other embodiments of the invention can include elemental maps, non-elemental maps, or other images created using other imaging methods such as energy filtered maps like EELS maps, SEM backscatter images, SEM secondary electron images, FIB images, or optical images. These images can be either produced at the same time or at different times.

In some embodiments, the results of each metrology tool may be depicted in every image in the set of well-registered images. In some embodiments, these results can be toggled on and off in order to show or hide the results from view, respectively. In some embodiments, the images can be layered on one another, preferably with the transparency of each image being adjustable. This facilitates the placement of metrology tools on different images by allowing the operator to simultaneously see the different features on different images, or to switch between images. The overlay can also be used to register the images.

In some embodiments of the invention, various ones of the layered images can also be combined into new single images. These new single images created from layered images can also be used as images of the well-registered image set and thus have the same properties of those images. They can also be used to create additional single layered images. In some embodiments of the invention, the layered images also have a control module that can toggle an image "on" or "off", thus controlling which images are seen and which images are hidden.

In some embodiments of the invention, the method of placing metrology tools on images is not limited in quantity to two images. There can be more than two images involved in the method of the invention to perform metrology activities.

In some embodiments of the invention, the images in the set of well-registered images can be changed between different color formats, such as grey-scale, contrast, etc.

Figure 5:
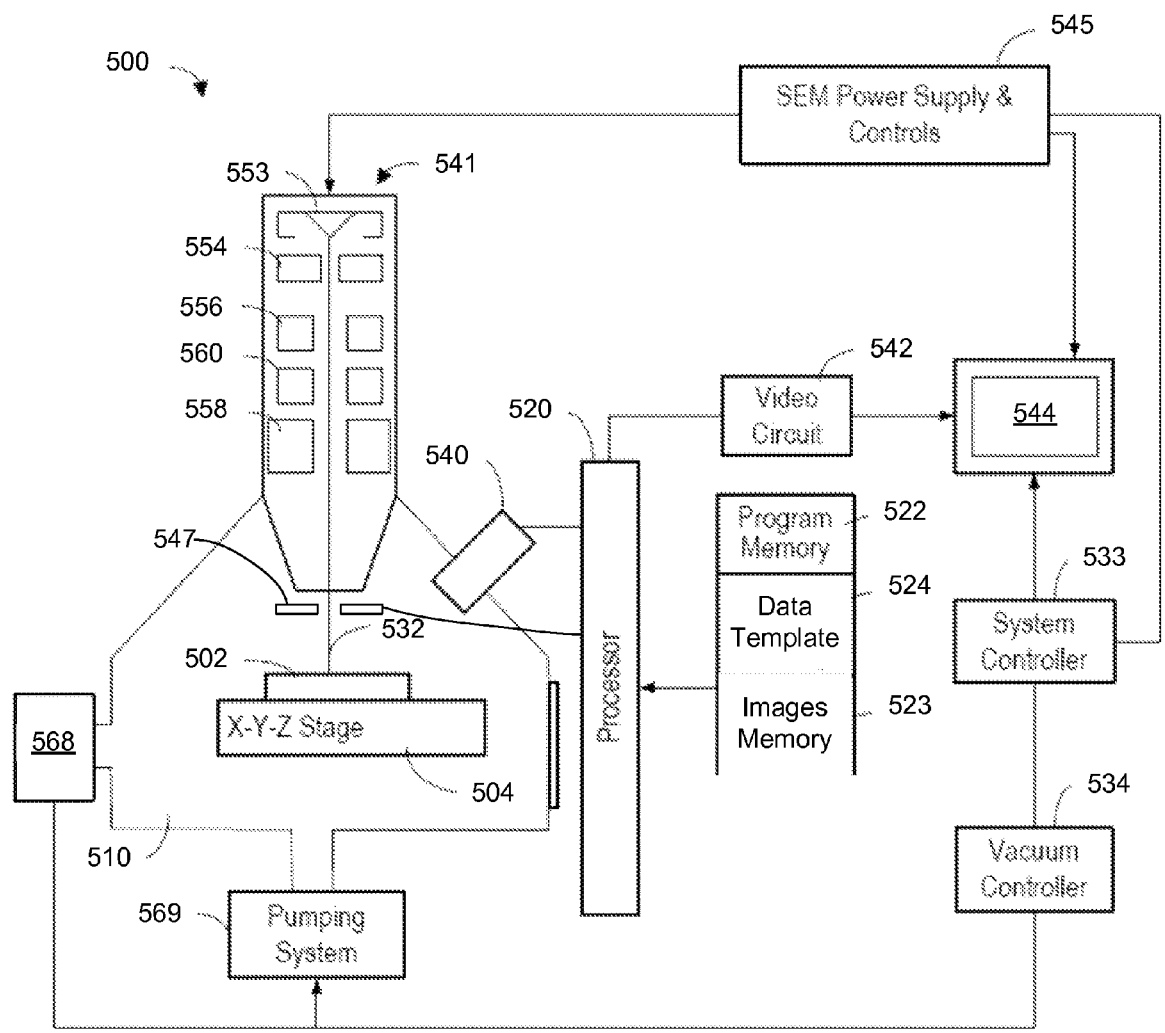
FIG. 5 is a scanning electron microscope suitable for implementing a program of some embodiments of the present invention.

FIG. 5 is an example of a scanning electron beam system 500 with an x-ray detector 540 suitable for implementing a program according to some embodiments of the present invention. A scanning electron microscope 541, along with power supply and control unit 545, is provided with system 500. An electron beam 532 is emitted from a cathode 553 by applying voltage between cathode 553 and an anode 554. Electron beam 532 is focused to a fine spot by means of a condensing lens 556 and an objective lens 558. Electron beam 532 is scanned two-dimensionally on the specimen by means of a deflection coil 560. Operation of condensing lens 556, objective lens 558, and deflection coil 560 is controlled by power supply and control unit 545.

A system controller 533 controls the operations of the various parts of scanning electron beam system 500. The vacuum chamber 510 is evacuated with ion pump 568 and mechanical pumping system 569 under the control of vacuum controller 534.

Electron beam 532 can be focused onto sample 502, which is on movable X-Y-Z stage 504 within lower vacuum chamber 510. When the electrons in the electron beam strike sample 502, the sample gives off x-rays whose energy is correlated to the elements in the sample. X-rays having energy inherent to the elemental composition of the sample are produced in the vicinity of the electron beam incident region. Emitted x-rays are collected by x-ray detector 540, preferably an energy dispersive detector of the silicon drift detector type, although other types of detectors could be employed, which generates a signal having an amplitude proportional to the energy of the detected x-ray. Backscattered electrons are detected by backscatter electron detector 547, which can comprise, for example, a microchannel plate or solid state detector.

Output from x-ray detector 540 is amplified and sorted by the processor 520, which counts and sorts the total number of X-rays detected during a specified period of time, at a selected energy and energy resolution, and a channel width (energy range) of preferably between 10-20 eV per channel. Similarly, output from BSE detector 547 is amplified and processed by processor 520. Processor 520 can comprise a computer processor; operator interface means (such as a keyboard or computer mouse); program memory 522 for storing data and executable instructions; interface means for data input and output; executable software instructions embodied in executable computer program code; and display 544 for displaying images and the results of user selected executable instructions on the images by way of video circuit 542.

Processor 520 can be a part of a standard laboratory personal computer, and is typically coupled to at least some form of computer-readable media. Computer-readable media, which include both volatile and nonvolatile media, removable and non-removable media, may be any available medium that can be accessed by processor 520. By way of example and not limitation, computer-readable media comprise computer storage media and communication media. Computer storage media include volatile and nonvolatile, removable and non-removable media implemented in any method or technology for storage of information such as computer-readable instructions, data structures, program modules or other data. For example, computer storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed by processor 520.

Program memory 522 can include computer storage media in the form of removable and/or non-removable, volatile and/or nonvolatile memory and can provide storage of computer-readable instructions, data structures, program modules and other data. Generally, the processor 520 is programmed by means of instructions stored at different times in the various computer-readable storage media of the computer. Programs and operating systems are typically distributed, for example, on floppy disks or CD-ROMs. From there, they are installed or loaded into the secondary memory of a computer. At execution, they are loaded at least partially into the computer's primary electronic memory. The invention described herein includes these and other various types of computer-readable storage media when such media contain instructions or programs for implementing the steps described below in conjunction with a microprocessor or other data processor. The invention also includes the computer itself when programmed according to the methods and techniques described herein.

Images obtained from the system can be stored in a portion of memory, such as the images memory portion 523. Data template memory portion 524 stores data templates, such as definitions of known spectra of elements or, in some embodiments, known diffraction patterns of materials for determining the elemental content of a sample.

While the embodiment shown includes a scanning electron microscope, other embodiments could use other instruments, such as, a transmission electron microscope, a scanning transmission electron microscope, or a focused ion beam microscope to generate images of the sample. An x-ray fluorescence system could also be used to generate x-rays from the sample. Other embodiments may detect other radiation, such as gamma rays, from a sample.

According to some embodiments of the preferred invention, a method of measuring a relationship between features in two different images of a work piece, the images produced by a charged particle beam system, comprises directing a charged particle beam toward a work piece; detecting first emissions from the work piece in response to the charged particle beam to produce a first image; detecting second emissions from the work piece in response to the charged particle beam or to a second charged particle beam to produce a second image; automatically locating a first feature in the first image; automatically locating a second feature in a second image, the second feature not being sufficiently discernible in the first image to determine a desired spatial relation between the first feature and the second feature; and measuring a spatial relationship of the first feature using spatial information from the second feature.

In some embodiments, automatically locating a first feature in the first image comprises locating a first edge in the first image; automatically locating a second feature in a second image comprises locating a second edge in the second image; and measuring a spatial relationship of the first feature using spatial information from the second feature comprises determining a spatial relationship involving the first and second edges. In some embodiments, automatically locating a first feature in the first image comprises locating multiple edges in the first image; automatically locating a second feature in a second image comprises locating a second edge in the second image; and measuring a spatial relationship of the first feature using spatial information from the second feature comprises determining a relationship between the multiple edges in the first image at a position determined using the edge in the second image.

In some embodiments, the method in which the second image is derived from emissions caused by the second beam. In some embodiments, detecting first emissions and detecting second emissions comprise detecting x-rays of different frequencies. In some embodiments, one of the first emissions and the second emissions comprises x-rays and the other of the first emissions and the second emissions comprise transmitted electrons, backscattered electrons, or secondary electrons.

In some embodiments, measuring a spatial relationship of the first feature using spatial information from the second feature comprises determining a separation of two edges in the first image at a specified distance from a line in the second image. In some embodiments, measuring a spatial relationship of the first feature using spatial information from the second feature comprises determining an angle between lines.

In some embodiments, directing a charged particle beam toward a work piece comprises scanning the work piece using a scanning electron microscope (SEM), a scanning transmission electron microscope (STEM), or a focused ion beam (FIB) microscope; or imaging the work piece using a transmission electron microscope (TEM). In some embodiments, detecting first emissions or detecting second emissions comprise detecting first emissions or detecting second emissions using different detectors. In some embodiments, the different detectors comprise different segments of a single detector.

In some embodiments, detecting first emissions and detecting second emissions is performed simultaneously during a single scan of the work piece. In some embodiments, detecting first emissions comprises detecting first emissions using a detector and in which detecting second emissions includes altering the detector before detecting second emissions using the same detector to form the second image. For example, a first image can be acquired by configuring the grid of an Everhardt-Thornley detector (ETD) to detect secondary electrons; a second image is then acquired by configuring the grid of the ETD to detect backscatter electrons. The voltage of the grid of an ETD is typically positive to detect secondary electrons and negative to detect backscatter electrons. In some embodiments, detecting second emissions includes altering the charged particle beam characteristics before detecting second emissions to form the second image. For example, a first SEM image is acquired using a charged particle beam with a 10 keV landing energy; a second SEM image is then acquired by altering the landing energy of the beam to 5 keV. An electron beam can be used to image features below a surface. A first landing energy can be used to form a first image of subsurface features, and then the landing energy can be changed to form a second image showing surface features or showing subsurface features at a different depth from that of the first image.

According to some embodiments of the present invention, a method of determining a spatial relationship of at least one feature on a first image of at least two images comprises acquiring at least two images using at least one detector in a charged particle beam system, selecting a first metrology tool from a set of metrology tools, the set of metrology tools comprising software processes that identify and locate at least one geometric feature or that determine a dimension or characteristic of at least one geometric feature in an image; placing the first metrology tool over a region containing a first geometric feature on the first image of the at least two images, the first metrology tool automatically locating the first geometric feature on the first image; performing the function of the first metrology tool; selecting a second metrology tool from the set of metrology tools; placing the second metrology tool over a region containing a second geometric feature on a second image of the at least two images, the second metrology tool automatically locating the second geometric feature on the second image; and performing the function of the second metrology tool, the result of performing the function of the first metrology tool defining a characteristic of performing the function of the second metrology tool.

In some embodiments, the first geometric feature is visible on the first image but not sufficiently visible on the second image and the second geometric feature is visible on the second image but not sufficiently visible on the first image. In some embodiments, the first geometric feature is visible on the first and second image but lacks sufficient contrast to be viable for use in performing accurate measurements. In some embodiments, the placement position of the second metrology tool is determined using information acquired from performing the function of the first metrology tool.

In some embodiments, the set of metrology tools comprises at least one of the following: arc finders, edge finders, line fit finders, or pattern locators. In some embodiments, the at least two images are acquired simultaneously by multiple detectors. In some embodiments, the at least two images are acquired sequentially by a single detector. Simultaneous acquisition of images is used herein to include obtaining signals from a single detector that is later analyzed to produce multiple images. For example, a spectrometer may collect spectral information as an electron beam is scanned, and then the spectral information may be analyzed into different elemental maps.

In some embodiments, the at least two images are acquired simultaneously by multiple detectors. In some embodiments, the at least two images are acquired sequentially by a single detector. In some embodiments, the images comprise EDX elemental maps, EELS maps, HAADF maps, simultaneous detector maps in a SEM configuration, SEM backscatter images, SEM secondary electron images, FIB images, or optical images.

In some embodiments, the method further comprises displaying the results of the second metrology tool on at least one image of the set of images or otherwise using the results in some manner. In some embodiments, performing the function of the metrology tools comprises performing at least one additional image, the at least one additional image displaying data determined from performing the function of the metrology tools.

In some embodiments, the method further comprises layering the at least two images on top of each other, creating a new image in addition to the at least two existing images. In some embodiments, the layered image has the ability to toggle the individual images on and off, on defines as the image being shown and off defined as the image being hidden. In some embodiments, layering the at least two images on top of each other further comprises the option of showing a percentage of the features of each of the at least two images in the layered image, the features appearing more transparent when selecting lower percentages.

In some embodiments, the at least two images are acquired by scanning the work piece using a scanning electron microscope (SEM), a scanning transmission electron microscope (STEM), or a focused ion beam (FIB) microscope; or imaging the work piece using a transmission electron microscope (TEM). In some embodiments, the multiple detectors comprise different segments of a single detector. In some embodiments, the at least two images are acquired during a single scan of the work piece.

In some embodiments, the at least two images are acquired using a single detector, the single detector capable of producing spectroscopic data which can be post-analyzed to create one or more images. In some embodiments, acquiring the at least two images comprises changing a characteristic of the incident beam from the beam characteristics used to obtain the first image to create the second image, the beam characteristic comprising the energy of the beam or the angle of the beam. In some embodiments, acquiring the at least two images comprises changing a characteristic of the detector from the detector characteristics used to obtain the first image to create the second image.

According to some embodiments of the present invention, a charged particle system for producing images of a work piece, comprises a charged particle beam column for directing a charged particle beam toward the work piece; at least one detector for detecting emissions from the work piece in response to the charged particle beam to produce at least one image; a processor for executing computer instructions; and a computer memory containing the computer instructions for automatically locating a first feature in the first image formed from emissions from the work piece in response to the charged particle beam to produce a first image; automatically locating a second feature in a second image formed from second emissions from the work piece in response to the charged particle beam to produce a second image, the second feature not being sufficiently discernible in the first image to determine a desired spatial relation between the first feature and the second feature; and measuring a spatial relationship of the first feature using spatial information from the second feature.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step. The term "dimension" includes any measurable spatial relationship, such as length, width, or angle.

In the following discussion and in the claims, the terms "including" and "comprising" are used in an open-ended fashion, and thus should be interpreted to mean "including, but not limited to . . . " To the extent that any term is not specially defined in this specification, the intent is that the term is to be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method of measuring a relationship between features in two different images of a work piece, the images produced by a charged particle beam system, comprising:
    directing a charged particle beam toward a work piece;
    detecting first emissions from the work piece in response to the charged particle beam to produce a first image;
    detecting second emissions from the work piece in response to the charged particle beam or to a second charged particle beam to produce a second image;
    automatically locating a first feature in the first image;
    automatically locating a second feature in a second image, the second feature not being sufficiently discernible in the first image to determine a desired spatial relation between the first feature and the second feature; and
    measuring a spatial relationship of the first feature using spatial information from the second feature.

2. The method of claim 1 in which:
    automatically locating a first feature in the first image comprises locating a first edge in the first image;
    automatically locating a second feature in a second image comprises locating a second edge in the second image; and
    measuring a spatial relationship of the first feature using spatial information from the second feature comprises determining a spatial relationship involving the first and second edges.

3. The method of claim 1, in which:
    automatically locating a first feature in the first image comprises locating multiple edges in the first image;
    automatically locating a second feature in a second image comprises locating a second edge in the second image; and
    measuring a spatial relationship of the first feature using spatial information from the second feature comprises determining a relationship between the multiple edges in the first image at a position determined using the edge in the second image.

4. The method of claim 1 in which the second image is derived from emissions caused by the second beam.

5. The method of claim 1 in which detecting first emissions and detecting second emissions comprise detecting x-rays of different frequencies.

6. The method of claim 1 in which one of the first emissions and the second emissions comprise x-rays and the other of the first emissions and the second emissions comprise transmitted electrons, backscattered electrons, or secondary electrons.

7. The method of claim 1 in which measuring a spatial relationship of the first feature using spatial information from the second feature comprises determining a separation of two edges in the first image at a specified distance from a line in the second image.

8. The method of claim 1 in which measuring a spatial relationship of the first feature using spatial information from the second feature comprises determining an angle between lines.

9. The method of claim 1 in which directing a charged particle beam toward a work piece comprises scanning the work piece using a scanning electron microscope (SEM), a scanning transmission electron microscope (STEM), or a focused ion beam (FIB) microscope; or imaging the work piece using a transmission electron microscope (TEM).

10. The method of claim 1 in which detecting first emissions or detecting second emissions comprise detecting first emissions or detecting second emissions using different detectors.

11. The method of claim 10 in which the different detectors comprise different segments of a single detector.

12. The method of claim 1 in which detecting first emissions and detecting second emissions is performed simultaneously during a single scan of the work piece.

13. The method of claim 1 in which detecting first emissions comprises detecting first emissions using a detector and in which detecting second emissions includes altering the detector before detecting second emissions using the same detector to form the second image.

14. The method of claim 13 in which altering the detector comprises changing the voltage at the detector to detect secondary electrons or backscattered electrons.

15. The method of claim 1 in which detecting second emissions includes altering the charged particle beam characteristics before detecting second emissions to form the second image.

16. The method of claim 15 in which altering the charged particle beam characteristics before detecting second emissions to form the second image includes changing the landing energy of the beam.

17. A method of determining a spatial relationship of at least one feature on a first image of at least two images comprising:
    acquiring at least two images using at least one detector in a charged particle beam system;
    selecting a first metrology tool from a set of metrology tools, the set of metrology tools comprising software processes that identify and locate at least one geometric feature or that determine a dimension or characteristic of at least one geometric feature in an image;
    placing the first metrology tool over a region containing a first geometric feature on a first image of the at least two images, the first metrology tool automatically locating the first geometric feature on the first image;
    performing the function of the first metrology tool;
    selecting a second metrology tool from the set of metrology tools;
    placing the second metrology tool over a region containing a second geometric feature on a second image of the at least two images, the second metrology tool automatically locating the second geometric feature on the second image; and
    performing the function of the second metrology tool, the result of performing the function of the first metrology tool defining a characteristic of performing the function of the second metrology tool.

18. The method of claim 17 in which the first geometric feature is visible on the first image but not sufficiently visible on the second image and the second geometric feature visible on the second image but not sufficiently visible on the first image.

19. The method of claim 15 in which the first geometric feature is visible on the first image but lacks sufficient contrast to be viable for use in performing accurate measurements.

20. The method of claim 10 in which the placement position of the second metrology tool is determined using information acquired from performing the function of the first metrology tool.

21. The method of claim 17 in which the set of metrology tools comprises at least one of the following: arc finders, edge finders, line fit finders, or pattern locators.

22. The method of claim 17 in which the at least two images are acquired simultaneously by multiple detectors.

23. The method of claim 17 in which the at least two images are acquired sequentially by a single detector.

24. The method of claim 17 in which the images comprise EDX elemental maps, EELS maps, HAADF maps, simultaneous detector maps in a SEM configuration, SEM backscatter images, SEM secondary electron images, FIB images, or optical images.

25. The method of claim 17 further comprises displaying the results of the second metrology tool on at least one image of the set of images or otherwise using the results in some manner.

26. The method of claim 17 in which performing the function of the metrology tools comprises producing at least one additional image, the at least one additional image displaying data determined from performing the function of the metrology tools.

27. The method of claim 17 further comprising layering the at least two images on top of each other, creating a new image in addition to the at least two existing images.

28. The method of claim 27 in which the layered image has the ability to toggle the individual images on and off, on defined as the image being shown and off defined as the image being hidden.

29. The method of claim 27 in which layering the at least two images on top of each other further comprises the option of showing a percentage of the features of each of the at least two images in the layered image, the features appearing more transparent when selecting lower percentages.

30. The method of claim 16 in which the at least two images are acquired by scanning the work piece using a scanning electron microscope (SEM), a scanning transmission electron microscope (STEM), or a focused ion beam (FIB) microscope; or imaging the work piece using a transmission electron microscope (TEM).

31. The method of claim 21 in which the multiple detectors comprise different segments of a single detector.

32. The method of claim 16 in which the at least two images are acquired during a single scan of the work piece.

33. The method of claim 16 in which the at least two images are acquired using a single detector, the single detector capable of producing spectroscopic data which can be post-analyzed to create one or more images.

34. The method of claim 16 in which acquiring the at least two images comprises changing a characteristic of the incident beam from the beam characteristics used to obtain the first image to create the second image, the beam characteristic comprising the energy of the beam or the angle of the beam.

35. The method of claim 16 in which acquiring the at least two images comprises changing a characteristic of the detector from the detector characteristics used to obtain the first image to create the second image.

36. A charged particle beam system for producing images of a work piece, comprising:
a charged particle beam column for directing a charged particle beam toward the work piece;
at least one detector for detecting emissions from the work piece in response to the charged particle beam to produce at least one image;
a processor for executing computer instructions; and
a computer memory containing the computer instructions for:
automatically locating a first feature in a first image formed from first emissions from the work piece in response to the charged particle beam to produce a first image;
automatically locating a second feature in a second image formed from second emissions from the work piece in response to the charged particle beam to produce a second image, the second feature not being sufficiently discernible in the first image to determine a desired spatial relation between the first feature and the second feature; and
measuring a spatial relationship of the first feature using spatial information from the second feature.

* * * * *